(12) United States Patent
Hosek

(10) Patent No.: US 8,874,258 B2
(45) Date of Patent: Oct. 28, 2014

(54) METHOD FOR TRANSPORTING A SUBSTRATE WITH A SUBSTRATE SUPPORT

(75) Inventor: Martin Hosek, Lowell, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 288 days.

(21) Appl. No.: 13/614,007

(22) Filed: Sep. 13, 2012

(65) Prior Publication Data

US 2013/0064637 A1    Mar. 14, 2013

Related U.S. Application Data

(60) Provisional application No. 61/573,850, filed on Sep. 13, 2011.

(51) Int. Cl.
*B65G 61/00* (2006.01)
*B65G 49/00* (2006.01)

(52) U.S. Cl.
USPC ............. 700/228; 396/12; 396/611; 414/800; 414/744.1; 414/744.3; 414/288; 73/659; 156/345.51

(58) Field of Classification Search
USPC ................. 700/228; 396/12, 611; 156/345.51, 156/345.54; 73/659; 414/800, 744.1, 744.3, 414/288
See application file for complete search history.

(56) References Cited

U.S. PATENT DOCUMENTS

| | | |
|---|---|---|
| 5,638,267 A | 6/1997 | Singhose et al. |
| 5,655,060 A | 8/1997 | Lucas et al. |
| 5,664,254 A * | 9/1997 | Ohkura et al. ................ 396/612 |
| 5,740,327 A | 4/1998 | Funaya |
| 5,789,890 A | 8/1998 | Genov et al. |
| 6,002,971 A | 12/1999 | Lucas |
| 6,216,058 B1 | 4/2001 | Hosek et al. |
| 6,224,312 B1 | 5/2001 | Sundar |
| 6,643,563 B2 | 11/2003 | Hosek et al. |
| 7,374,393 B2 * | 5/2008 | Rice et al. ..................... 414/800 |
| 8,528,889 B2 * | 9/2013 | Nakano et al. ............ 269/289 R |
| 2003/0108415 A1 | 6/2003 | Hosek et al. |
| 2008/0152463 A1 | 6/2008 | Chidambaram et al. |
| 2009/0249880 A1 * | 10/2009 | Lim ................................ 73/659 |
| 2010/0222898 A1 | 9/2010 | Yang |
| 2010/0243168 A1 * | 9/2010 | Nakano et al. ........... 156/345.54 |
| 2010/0280654 A1 * | 11/2010 | Rice et al. ..................... 700/228 |
| 2012/0141237 A1 * | 6/2012 | Rice et al. ............... 414/226.05 |

OTHER PUBLICATIONS

Dubowsky et al., "Optimal Dynamic Trajectories for Robotic Manipulators", Theory and Practice of Robots and Manipulators (copyright 1985), Proceedings of RoManSy '84: The Fifth CISM-IFToMM Symposium, Jun. 29, 1984, pp. 133-143.

(Continued)

*Primary Examiner* — Ronnie Mancho
(74) *Attorney, Agent, or Firm* — Iandiorio Teska & Coleman, LLP

(57) ABSTRACT

A method of transporting a substrate with a substrate support, the method includes defining a frictional breakaway force between the substrate and the substrate support in a horizontal plane, moving the substrate in the horizontal plane along a horizontal trajectory, moving the substrate in a vertical direction along a vertical trajectory simultaneously while moving the substrate in the horizontal plane, and wherein the horizontal trajectory is determined based on the acceleration profile of the vertical trajectory and wherein the horizontal trajectory prevents the moving of the substrate from overcoming the coefficient of friction in the horizontal plane.

20 Claims, 5 Drawing Sheets

(56) References Cited

OTHER PUBLICATIONS

Bobrow et al., "Time-Optimal Control of Robotic Manipulators Along Specified Paths", International Journal of Robotics Research, vol. 4, No. 3, pp. 3-17, Fall, 1985.

Pfeiffer et al., "A Concept for Manipulator Trajectory Planning", IEEE Journal of Robotics and Automation, vol. RA-3, No. 2, pp. 115-123, Apr. 1987.

Rieswijk et al., "A Robust and Efficient Approach for the Time Optimization of Path Constrained Motions of Robotic Manipulators Incorporating Actuator Torque and Jerk Constraints", Proceedings of 1992 IEEE International Symposium on Intelligent Control, pp. 507-513.

Shiller et al., "Robot Path Planning with Obstacles, Actuator, Gripper, and Payload Constraints", The International Journal of Robotics Research, vol. 8, No. 6, pp. 3-18, Dec. 1989.

Shin et al., "Minimum-Time Control of Robotic Manipulators with Geometric Path Constraints", IEEE Transactions on Automatic Control, vol. AC-30, No. 6, pp. 531-541, Jun. 1985.

Slotine et al., "Improving the Efficiency of Time-Optimal Path-Following Algorithms", IEEE Transactions on Robotics and Automation, vol. 5, No. 1, pp. 118-124, Feb. 1989.

Written Opinion of the International Searching Authority for International Application No. PCT/US 12/000395, Jan. 15, 2013, 5 pgs. (unnumbered).

* cited by examiner

50

```
┌─────────────────────────────────┐
│ Defining a frictional breakaway │
│    force between the substrate  │
│   and the substrate support in  │
│        a horizontal plane       │
│                52               │
└─────────────────────────────────┘
                │
                ▼
┌─────────────────────────────────┐
│  The substrate is moved in the  │
│  horizontal plane along a       │
│       horizontal trajectory     │
│                54               │
└─────────────────────────────────┘
                │
                ▼
┌─────────────────────────────────┐
│   The substrate is moved in a   │
│  vertical direction along a     │
│     vertical trajectory         │
│  simultaneously while moving the│
│   substrate in the horizontal   │
│             plane               │
│                56               │
└─────────────────────────────────┘
                │
                ▼
┌─────────────────────────────────┐
│ The horizontal trajectory is    │
│ determined based on the         │
│ acceleration profile of the     │
│ vertical trajectory and wherein │
│ the horizontal trajectory       │
│ prevents the moving of the      │
│ substrate from overcoming the   │
│ coefficient of friction in the  │
│         horizontal plane        │
│                58               │
└─────────────────────────────────┘
```

METHOD FOR TRANSPORTING A SUBSTRATE WITH A SUBSTRATE SUPPORT

RELATED APPLICATIONS

This application claims benefit of and priority to U.S. Provisional Application Ser. No. 61/573,850 filed Sep. 13, 2011 under 35 U.S.C. §§119, 120, 363, 365, and 37 C.F.R. §1.55 and §1.78 incorporated herein by this reference.

FIELD

The disclosed embodiment relates to a method for transporting a substrate with a substrate support.

BACKGROUND

The existing manufacturing technologies for semiconductor integrated circuits and flat panel displays may include processing of silicon wafers and glass panels, often referred to as substrates, in fully automated vacuum cluster tools, which may utilize robotic manipulators to cycle the substrates through individual stations and operations performed in the tools.

The robotic manipulators typically hold the substrate subject to processing by means of frictional force between the substrate and the robot end-effector. The force may be supplemented by a vacuum or electrostatic hold-down in some applications. Since the inertial force at the substrate must not exceed the holding force securing the substrate to the end-effector in order to prevent undesirable slippage, the acceleration of the substrate must be limited accordingly. Additional constraints, such as limited velocity and jerk, are typically required for safe operation and trajectory tracking reasons. For maximum throughput levels, an efficient method for calculating a substrate transfer trajectory without causing the substrate carried by the robotic manipulator to slide, and without violating other prescribed constraints, may be required.

Conventional methods in the area of time-optimum trajectory may include a number of algorithms which can potentially be applied or extended to the above applications. Conventional trajectory generation algorithms for transporting a substrate with a support typically take into account the acceleration components in the plane of operation of the arm of the robotic manipulator but may fail to consider the effects of vertical acceleration and deceleration that often takes place, e.g., during rotational moves of the robotic manipulator as the height of the arm of the robotic manipulator needs to adjust to different elevations of the stations in the tool. This may result in non-uniform slippage margins and suboptimal throughput performance. The slippage margins are further eroded due to vertical oscillations of the robot end-effector, which is often excited by vertical moves. In addition, the trajectories for the moves in the plane of operation of the arm of the robotic manipulator may have high frequency content, which requires high controller bandwidth for acceptable tracking.

In summary, conventional trajectory generation algorithms for transporting a substrate with a support may suffer from one or more of the following deficiencies: (1) Trajectories for rotary (T-axis) and vertical (Z-axis) moves may not be fully synchronized. The trajectories may start substantially at the same time, but their durations may generally be different. A Z-axis move may finish earlier than the simultaneous T-axis move, meaning that an unnecessarily high Z-axis acceleration and/or deceleration may be used. This may unnecessarily reduce the frictional force available to hold the substrate and may cause more end-effector vibration, which may further reduce the available frictional force. A T-axis move may finish earlier than the simultaneous Z-axis move. This may result in the substrate being subject to unnecessarily high acceleration force in the plane of operation of the arm of the robotic manipulator, i.e., in the plane of the end-effector. This may unnecessarily reduce the slippage margin, (2) T-axis trajectories do not take into account acceleration and deceleration effects of the Z-axis which may affect the frictional force available to hold the substrate. T-axis moves have a reduced slippage margin when the available frictional force is reduced due to acceleration or deceleration of the Z-axis. This occurs in the deceleration phase of upward Z-axis moves and acceleration phase of downward Z-axis moves. T-axis moves are slower than they can be when the available frictional force is increased due to acceleration or deceleration of the Z-axis. This occurs in the acceleration phase of upward Z-axis moves and deceleration phase of downward Z-axis moves. (3) The frictional force available to hold the substrate and, therefore, the slippage margin may be reduced due to vibration of the robot end-effector which may be excited by execution of a Z-axis trajectory. (4) The trajectories for the moves in the plane of operation of the arm of the robotic manipulator may have high frequency content which may require high bandwidth of the motion controller to achieve acceptable tracking errors. This may lead to closed-loop stability issues, particularly in direct-drive robotic manipulators.

SUMMARY OF THE INVENTION

In one aspect, a method of transporting a substrate with a substrate support is featured. The method includes defining a frictional breakaway force between the substrate and the substrate support in a horizontal plane, moving the substrate in the horizontal plane along a horizontal trajectory, moving the substrate in a vertical direction along a vertical trajectory simultaneously while moving the substrate in the horizontal plane, and wherein the horizontal trajectory is determined based on the acceleration profile of the vertical trajectory and wherein the horizontal trajectory prevents the moving of the substrate from overcoming the coefficient of friction in the horizontal plane.

In one embodiment, the horizontal plane substantially may coincide with an interface between the substrate and the substrate support. An acceleration phase and a deceleration phase of the horizontal trajectory may be asymmetric. At least one of the horizontal trajectory and the vertical trajectory may be frequency shaped and configured to not excite a natural frequency of the substrate support and/or limit a control bandwidth. The horizontal trajectory may include one or more components in more than one direction. The frictional breakaway force may be a variable function of an acceleration component perpendicular to the plane and a coefficient of friction. The horizontal trajectory may be configured as a function of the vertical trajectory.

In another aspect, a method of transporting a substrate with a substrate support is featured. The method includes defining a maximum holding force between the substrate and the substrate support in a plane, moving the substrate in the plane along a first trajectory, moving the substrate in a vertical direction along a second trajectory simultaneously while moving the substrate in the plane, and wherein a maximum holding force is a function of the second trajectory and a coefficient of friction between the substrate and the substrate support and wherein the first trajectory has an acceleration change based on the acceleration of the second trajectory and wherein the acceleration change prevents the substrate from overcoming the maximum holding force in the plane and/or exceeding a control bandwidth.

In one embodiment the plane substantially may coincide with an interface between the substrate and the substrate support. An acceleration phase and a deceleration phase of the first trajectory may be asymmetric. At least one of the first trajectory and the second trajectory may be frequency shaped and configured to not excite a natural frequency of the substrate support. The first trajectory may include one or more components in more than one direction. The first trajectory may include one or more linear components and one or more rotational components. The first trajectory may be configured as a function of the second trajectory.

In another aspect, a method of transporting a substrate with a substrate transport is featured. The method includes defining a bandwidth of the substrate transport, moving a substrate along a motion profile, and wherein the motion profile has selectable frequency components removed with respect to the bandwidth of the substrate transport.

In one embodiment, the motion profile may be frequency shaped with at least one of a notch filter, a band stop filter or a low pass filter. The bandwidth may comprise defining a natural frequency of the substrate transport and wherein the motion profile may be frequency shaped to substantially not excite the natural frequency of the substrate transport. A vertical component of the motion profile may be frequency shaped such that the vertical component of the motion profile substantially does not excite a natural frequency of the substrate transport in a vertical direction. In a planar component of the motion profile may be frequency shaped such that the planar component of the motion profile substantially does not excite a natural frequency of the substrate transport in a planar direction. A rotational component of the motion profile may be frequency shaped such that the rotational component of the motion profile substantially does not excite a natural frequency of the substrate transport in a rotational direction.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 3 is a flowchart showing the primary steps of yet another example of the method of transporting a substrate with a substrate support of the disclosed embodiment;

DETAILED DESCRIPTION OF THE INVENTION

Figure 1:
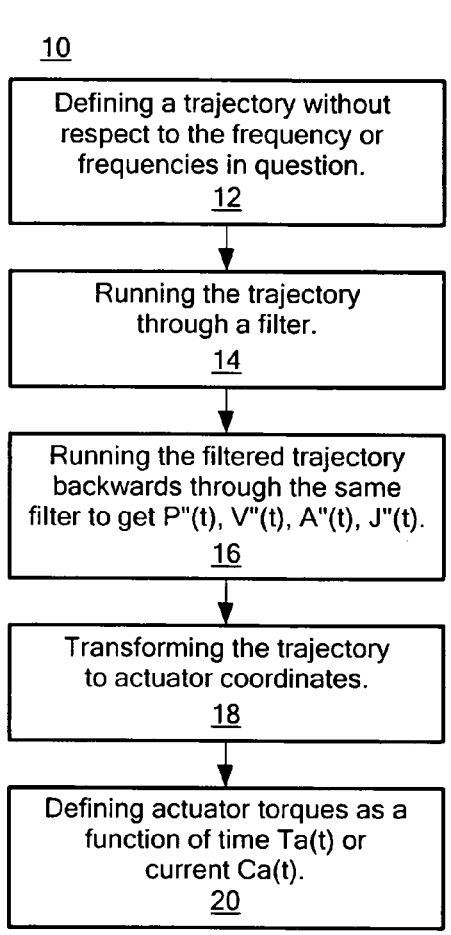
FIG. 1 is a flowchart showing the primary steps of one example of the method of transporting a substrate with a substrate support of the disclosed embodiment.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 one embodiment of method 10 for transporting a substrate with a substrate support in accordance with the disclosed embodiment. Method 10 includes defining a trajectory without respect to the frequency or frequencies in question, step 12. The trajectory may have components such as position, velocity, acceleration, jerk as a function of time, and the like. The trajectory may have one or more components, e.g., R, T, Z at the substrate or otherwise. Alternately, the trajectory may be transformed from the wafer coordinates to joint or actuator coordinates. Method 10 also includes running the trajectory through a filter, step 14. This may be done by running, for example, P(t), V(t), A(t), J(t) through the filter to get P'(t), V'(t), A'(t), J'(t). Alternately, only P(t) may be run through the filter and the remaining components derived, for example by differentiating. In one example, method 10 may include running the filtered trajectory backwards through the same filter to get P"(t), V"(t), A"(t), J"(t), step 16. Step 16 is optional and may be done to reduce latency and/or phase shift. Method 10 also includes transforming the trajectory to actuator coordinates, e.g., Pa(t), Va(t), Aa(t), step 18. This may be done, for example, using inverse kinematics. Method 10 also includes defining actuator torques as a function of time Ta(t) or current Ca(t), step 20. This may be done by running the trajectory through a dynamic model. With current controller technology, steps. Using current controller technology, steps 18 and 20 may be done various non limiting ways known by those skilled in the art.

Figure 2:
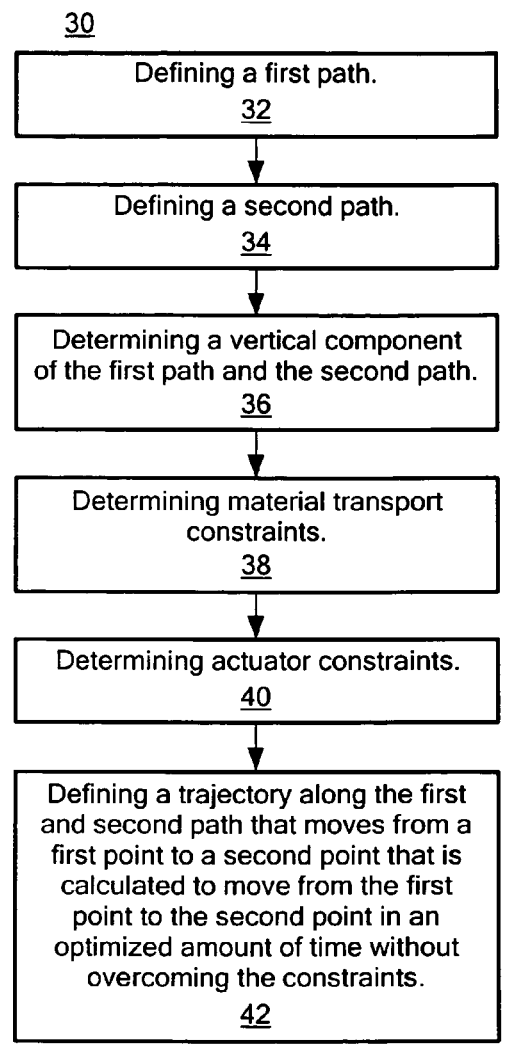
FIG. 2 is a flowchart showing the primary steps of another example of the method of transporting a substrate with a substrate support of the disclosed embodiment.

Method 30, FIG. 2, for transporting a substrate with a substrate support of another embodiment of the disclosed embodiment includes defining a first path, step 32. This may be in one or more directions. For example, the path may be defined in a plane that coincides with the end-effector wafer supports where the plane may be vertically or otherwise moveable. The directions along the path may be linear, e.g., a purely radial path. The directions along the path may be rotational, e.g., a purely rotational path. The first path may be combinations of linear, radial or other suitable direction or otherwise, e.g., the first path, may not just be in the plane. Method 30 also includes defining a second path, step 34. This may be in one or more directions. For example, the path may be defined in a vertical direction. The directions along the path may be a combination of vertical and other directions. The directions along the path may be rotational, e.g., a purely rotational path. The first path may be combinations of linear, radial or other suitable direction or path. Method 30 also includes determining a vertical component of the first path and the second path, step 36. In the event the second path is purely vertical, step 36 is not required. Method 30 also includes determining material transport constraints, step 38. For example, step 38 may be applied between the substrate or material being transferred and the substrate support of the transport robot or device. These constraints may include maximum acceleration in a plane defined such that it coincides with the end-effector wafer supports. In this example, the maximum acceleration may be a function of a vertical component of acceleration such that a coefficient of friction is not overcome between the substrate and the substrate support.

Constraints may include a coefficient of friction, a safety margin, maximum jerk, maximum velocity or other suitable constraint. Method 30 also includes determining actuator constraints, step 40. The actuator constraints determined may include maximum velocity, maximum torque, position range, workspace, and the like. Each may be a function of one or more of the other and/or other factors. Method 30 also includes defining define a trajectory along the first and second path that moves from a first point to a second point that is calculated to move from the first point to the second point in an optimized amount of time without overcoming the constraints, step 42. For example, if the first path is in the plane as described and rotational and the second path is in a vertical direction, the acceleration component in the vertical direction may be increased to allow a higher rotational acceleration or velocity during the rotational move without the substrate slipping. Similarly, the deceleration component in the vertical direction may be decreased to allow a higher rotational acceleration or velocity during the rotational move without the substrate slipping as compared to if a higher deceleration component was used. In one example, the trajectory may be defined such that the acceleration and deceleration components in the first path is adjusted based on the vertical acceleration and deceleration components, e.g., of the second path such that the substrate does not slip. This may provide a shorter time point to point as compared to trajectories that do not factor in such vertical acceleration components.

Method 50 for transporting a substrate with a substrate support in accordance with another embodiment of the disclosed embodiment is now discussed with reference to FIG. 3. Method 50 preferably includes at least the following steps. Defining a frictional breakaway force between the substrate and the substrate support in a horizontal plane, step 52. The frictional breakaway force may be a function of the coefficient of friction, gravity and the vertical acceleration, e.g., the z component of acceleration and may have a safety factor. The breakaway frictional force may be where the payload breaks away from the support due to overcoming the coefficient of friction. The substrate is then moved in the horizontal plane along a horizontal trajectory, step 54. The substrate is then moved in a vertical direction along a vertical trajectory simultaneously while moving the substrate in the horizontal plane, step 56. The horizontal trajectory is determined based on the acceleration profile of the vertical trajectory and the horizontal trajectory prevents the moving of the substrate from overcoming the coefficients of friction in the horizontal plane, step 58.

Figures 4, 5:
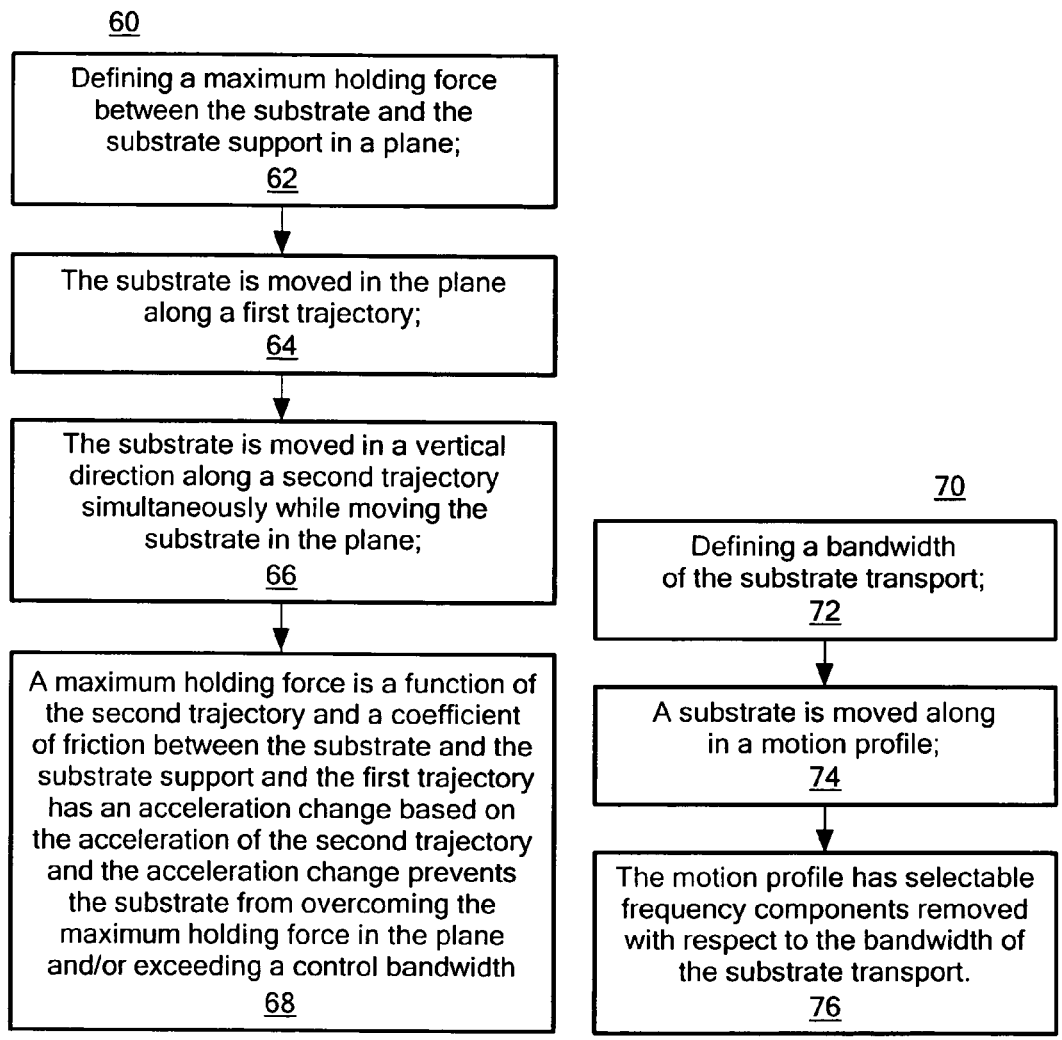
FIG. 4 is a flowchart showing the primary steps of yet another example of the method of transporting a substrate with a substrate support of the disclosed embodiment.
FIG. 5 is a flowchart showing the primary steps of yet another example of the method of transporting a substrate with a substrate support of the disclosed embodiment.

Method 60 for transporting a substrate with a substrate support in accordance with the disclosed embodiment is now discussed with reference to FIG. 4. Method 60 preferably includes at least the following steps. Defining a maximum holding force between the substrate and the substrate support in the horizontal plane, step 62. The substrate is moved in the plane along a first trajectory, step 64. The substrate is moved in a vertical direction along a second trajectory simultaneously while moving the substrate in the plane, step 66. A maximum holding force is preferably defined to be a function of the second trajectory in a coefficient of friction between the substrate and the substrate support and the first trajectory has an acceleration change based on the acceleration of the second trajectory and the acceleration change prevents the substrate from overcoming the maximum holding force in the plane and/or exceeding a control bandwidth, step 68. Control bandwidth is a maximum frequency that a controller can respond to, e.g., where the magnitude of the frequency response drops by 3 decibels or other suitable selected frequency at any suitable attenuation or otherwise.

Method 70 for transporting a substrate with a substrate support in accordance with another embodiment of the disclosed embodiment is now discussed with reference to FIG. 5. Method 70 preferably includes at least the following steps. Defining a bandwidth of the substrate support, step 72. A substrate is moved along a motion profile, step 74. The motion profile has selectable frequency components removed with respect to the bandwidth of the substrate transport.

Figure 6:
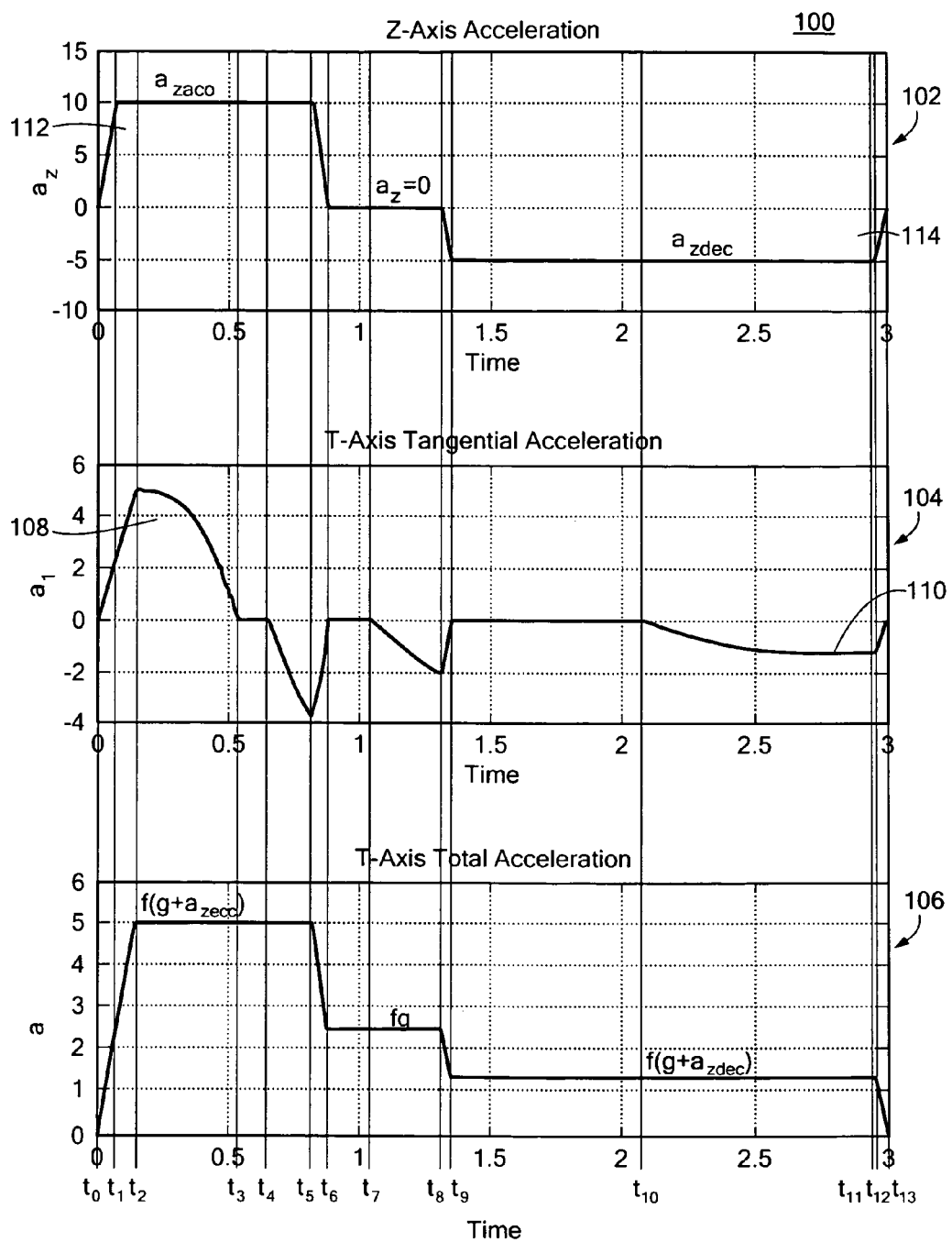
FIG. 6 shows an exemplary profiles for the method of transporting a substrate with a substrate support of the disclosed embodiment.
Figure 7:
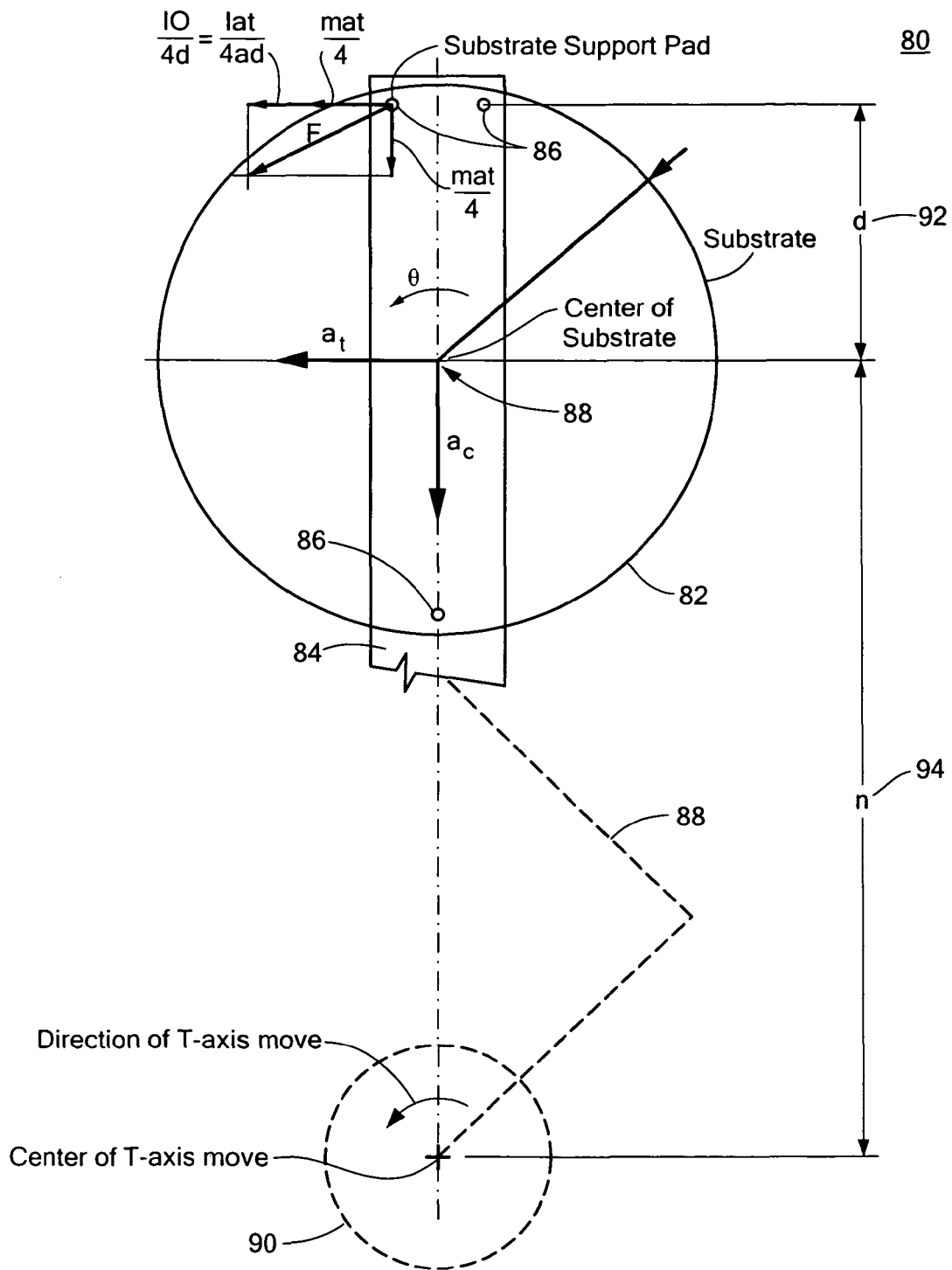
FIG. 7 shows an exemplary transport system for transporting a substrate with a substrate support of the disclosed embodiment.

As shown in FIG. 6, an exemplary profile 100 is shown with respect to the method of transporting a substrate with a substrate support. FIG. 7 shows an exemplary transport system 80 having substrate 82 and support 84 with support 84 having substrate support pads 86. Here, pads 86 are shown with 3 pads. Alternately, more, less or no pads may be provided. FIG. 6 shows a partial view of an exemplary trajectory set 100 having a z axis acceleration component 102, a T axis tangential acceleration component 104 and a T axis total acceleration component 106. The total acceleration 106, FIG. 6, at one or more points 88, FIG. 7, during the motion profile may be shown, e.g., by profile 106, FIG. 6. In the embodiment shown, a maximum holding force or frictional breakaway force is defined between the substrate and the substrate support, e.g., in a plane, such as a horizontal plane. Here, the frictional breakaway force may be a function of the coefficient of friction between the payload and the payload support, gravity, safety factor and a vertical acceleration component, for example, Z acceleration. The holding or breakaway force may be the force or acceleration applied to the substrate at which the substrate slips or moves with respect to the support and may have a safety margin or factor or other suitable factor. As seen in profile 106, the allowable breakaway force may increase or decrease as a function of the Z axis acceleration as corresponding to profile 102. Further, the horizontal plane may substantially coincide with an interface 86, FIG. 7, between the substrate 82 and the substrate support 84 and where the interface may simple be support 84 and where the plane may move, e.g., vertically with Z. In the exemplary embodiment, substrate 82 is moved in the plane or horizontal plane along a first or horizontal trajectory, for example, as shown by T trajectory 104, FIG. 6. Further, substrate 82, FIG. 7, is moved in a vertical direction along a second or vertical trajectory 102 simultaneously while moving substrate 82 in the horizontal plane. The horizontal trajectory 104 is determined based on the acceleration profile 102 of the vertical trajectory where the horizontal trajectory 104 prevents the moving of substrate 82 from overcoming the frictional breakaway force in the horizontal plane. Here, the maximum holding force is a function of the second trajectory 102 and a coefficient of friction between the substrate 82 and the substrate support 84 where the first trajectory 104 has one or more acceleration changes based on the acceleration of the second trajectory 102 where the acceleration change prevents the substrate from overcoming the maximum holding force in the plane. As described, the frictional breakaway force may be a function of the coefficient of friction between the payload and the payload support, gravity, and a vertical acceleration component, for example, Z acceleration. As described, the horizontal plane may substantially coincide with an interface between the substrate and the substrate support. As seen in profile 104, an acceleration phase 108 and a deceleration phase 110 of the horizontal trajectory may be asymmetric. As seen in profile 102, an acceleration phase 112 and a deceleration phase 114 of the vertical trajectory may also be asymmetric. Further and as described, at least one of the horizontal trajectory 104 and the vertical trajectory 102 may be frequency shaped so as not to excite a natural frequency of the substrate support and/or limit a control bandwidth. Although trajectory 104 is described with respect to a T axis, the horizontal trajectory has, or may have, components in more than one direction. As described, the frictional breakaway force is a variable function of a coefficient of friction and an acceleration component in a direction perpendicular to the plane, for example, in a z direction. Here, the horizontal trajectory 104 is shown as a function of the vertical trajectory 102. As described, at least one of the first trajectory 104 and the second trajectory 102 may be frequency shaped so as not to excite a natural frequency of the substrate support and/or exceed a control bandwidth. Here, the control bandwidth may correspond to a maximum frequency of a controller or that a system may respond to, for example, where the magnitude of a frequency response drops by three decibels, or otherwise. Here, either the first or second trajectory may have more than one component, for example, linear components and rotational components or any of 1-6 axes. In the embodiment shown, a bandwidth of the substrate transport may be defined with the substrate along a motion profile. As such, the motion profile may be frequency shaped such that the motion profile has selectable frequency components removed with respect to the bandwidth of the substrate transport. Here, the bandwidth of the substrate transport may be one or more natural frequencies, a controller or system bandwidth or any suitable frequency, response or amplitude profile or profiles. By way of example, the motion profile may frequency shaped with at least one of a notch, band stop or low pass filter. By way of further example, the bandwidth may be a natural frequency of the substrate transport where the motion profile is frequency shaped such that the motion profile substantially does not excite the natural frequency of the substrate transport. For example, a vertical component of the motion profile may be frequency shaped such that the vertical component of the motion profile substantially does not excite a natural frequency of the substrate transport in a vertical direction. Further, a planar component of the motion profile may be frequency shaped such that the planar component of the motion profile substantially does not excite a natural frequency of the substrate transport in a planar direction. Further, a rotational component of the motion profile may be frequency shaped such that the rotational component of the motion profile substantially does not excite a natural frequency of the substrate transport in a rotational direction. In alternate aspects, more or less features may be provided in any suitable combination.

FIG. 7 shows an exemplary end-effector 84 and substrate 80 coupled to an exemplary arm 88 and drive 90. Typically, when the robot performs a T-axis move, the substrate on the robot end-effector may be subject to a combination of simultaneous translational and rotational motion in the plane of the T-axis move. In particular, the center of the substrate may move along a circular arc (translational motion component) and the substrate may simultaneously rotate with respect to the center of the substrate (rotational motion component). In order to prevent slippage of the substrate on the robot end-effector, the effect of the rotational motion may be accounted for in the trajectory generation process by adjusting the input parameters (the radius of the T-axis move and the variable maximum allowable acceleration for the T-axis move) based on the shape of the substrate and geometry of the contact forces between the substrate and the robot end-effector. Alternately, the effect of the rotation motion may not be accounted for. As an example, a typical robot end-effector 84 with three substrate support pads 86 is considered as shown in FIG. 7. It is assumed that one of the substrate support pads may be located between the center of the substrate and the center of the T-axis move. It is further assumed that two of the substrate support pads, referred to as the outer substrate pads, may be positioned close to each other at distance d 92 from the center of the substrate (at radius r 94) toward the tip of the robot end-effector. The force transmitted by the outer substrate support pads may be approximated by the following expression $$F = \frac{1}{4}\sqrt{\left[\left(m + \frac{I}{rd}\right)a_t\right]^2 + [ma_c]^2} \quad (1)$$

where $a_c$ is the centrifugal acceleration of the substrate, $a_t$ is the tangential acceleration of the substrate, I is the inertia of the substrate, m is the mass of the substrate, and r is the radius of the T-axis move. For a circular substrate with inertia I=0.5 m$\rho^2$, Equation (1) can be rewritten as $$F = \frac{m}{4}\sqrt{\left[\left(1 + \frac{\rho^2}{2rd}\right)a_t\right]^2 + a_c^2} \quad (2)$$

where $\rho$ is the radius of the substrate. In order to prevent slippage of the substrate on the robot end-effector, it can be assumed that the following condition may need to be satisfied $$F \leq fma_n/4 \quad (3)$$

where $a_n$ is the vertical acceleration that determines the normal force between the substrate and the robot end-effector, for example, resulting from a combination of the gravity acceleration and the acceleration of a simultaneous Z-axis move, and f is the coefficient of friction between the substrate and the robot end-effector substrate support pads. Utilizing Equation (2), the slippage condition of Equation (3) can be expressed as $$\sqrt{\left[\left(1 + \frac{\rho^2}{2rd}\right)a_t\right]^2 + a_c^2} \leq fa_n \quad (4)$$

Assuming that the outer support pads are located close to the edge of the circular substrate, i.e., d is substantially equal to $\rho$, and substituting $v^2/r$ for $a_c$, the slippage condition can be approximated as $$\sqrt{\left[\left(1 + \frac{\rho}{2r}\right)a_t\right]^2 + \left[\frac{v^2}{r}\right]^2} \leq fa_n \quad (5)$$

where v is the velocity of the center of the substrate. Finally, the approximate slippage condition of Equation (4) can be expressed as $$\sqrt{a_t^2 + (v^2/\tilde{r})^2} \leq \tilde{a}_{max} \quad (6)$$

where $$\tilde{r} = r + \rho/2 \quad (7)$$

$$\tilde{a}_{max} = 2rfa_n/(2r+\rho) \quad (8)$$

Equation (6) has the form of a typical slippage constraint for a T-axis move without the rotational motion component taken into account. Therefore, the trajectory for the T-axis move with the rotational motion component taken into account may be obtained based on substantially the same calculations as for the case when it is not taken into account, provided that the radius of the T-axis move used in the calculations is adjusted according to Equation (7) and the variable maximum allowable acceleration for the T-axis move is determined using Equation (8).

In the present trajectory generation approach, the motion profiles, for example as shown by way of example in FIG. 6, for each axis may be obtained using a number of mathematical techniques and optimization algorithms. An example technique suitable for calculation of the motion profiles may be described as follows. In alternate aspects, any suitable technique may be provided. Although the exemplary trajectory generation method is described with respect to an exemplary Z (vertical) and T (rotational) axis or trajectories, in alternate aspects, compound moves may be provided, for example, where one or more of the trajectories may have moves in any suitable degree of freedom and where one or more vertical component (Z in the present example) may be extracted to allow factoring in the resultant allowable acceleration or trajectory change, for example, in a horizontal plane or otherwise. Accordingly, all such variants may be provided.

By way of example, the inputs to the trajectory calculation may include the desired travel distance of the Z-axis, $s_Z$, maximum allowable velocity of the Z-axis, $v_{Zmax}$, maximum allowable acceleration of the Z-axis, $a_{Zmax}$, and maximum allowable jerk of the Z-axis, $j_{Zmax}$. The inputs to the trajectory calculation may further include the desired travel distance of the T-axis, $S_T$, maximum allowable velocity of the T-axis, $v_{Tmax}$, maximum allowable tangential jerk of the T-axis, $j_{Tmax}$, and coefficient of friction between the substrate and the robot end-effector, f.

Considering the above inputs, the motion profiles may be calculated as a solution to the optimization problem formulated in Equation (9) subject to the constraints of Equation (10)

$$\Delta t_f(a^*_{Zacc}, a^*_{Zdec}) = \min \Delta t_f(a_{Zacc}, a_{Zdec}) \quad (9)$$

$$a_{Zacc} \leq a_{Zmax} \text{ and } a_{Zdec} \geq -a_{Zmax} \quad (10)$$

where $$\Delta t_f = abs(t_{Tf} - t_{Zf}) \quad (11)$$

and $t_{Tf}$ is the final time of the trajectory for the T-axis, $t_{Zf}$ is the final time of the trajectory for the Z-axis, $a_{Zacc}$ is the maximum acceleration of the Z-axis in the acceleration phase of the Z-axis trajectory, $a_{Zdec}$ is the maximum deceleration of the Z-axis in the deceleration phase of the Z-axis trajectory, and $a_{Zacc}^*$ and $a_{Zdec}^*$ represent optimal values of $a_{Zacc}$ and $a_{Zdec}$, respectively.

In the optimization process, the trajectory for the Z-axis may be calculated as a function of $s_Z$, $v_{Zmax}$, $j_{Zmax}$, $a_{Zacc}$ and $a_{Zdec}$, including the time instants that may define constant jerk, acceleration and velocity intervals, $t_{Zi}$, where i=1, 2, ..., $n_Z$ and $n_z$ is the number of intervals the Z-axis trajectory consists of, and the final time of the Z-axis trajectory, $t_{Zf}$ may be determined as $t_{Zf} = t_{Zi}$ for i=$n_Z$.

Once the trajectory for the Z-axis has been calculated, the trajectory for the T-axis, may be determined uniquely as a function of $S_T$, $v_{Tmax}$, $j_{Tmax}$, f, $a_{Zacc}$, $a_{Zdec}$ and $t_{Zi}$, i=1, 2, ..., $n_Z$, including the time instants that may define intervals where a single constraint may be active, $t_{Ti}$, where i=1, 2, ..., $n_T$ and $n_T$ is the number of intervals the T-axis trajectory consists of, and the final time of the T-axis trajectory, $t_{Tf}$ may be obtained as $t_{Tf} = t_{Ti}$ for i=$n_T$.

A number of optimization algorithms, for example, Newton's method or steepest descent method, may be employed to solve the above optimization problem. It may be observed that increasing $a_{Zacc}$ tends to reduce both $t_{Tf}$ and $t_{Zf}$. On the other hand, a change in $a_{Zdec}$ tends to have an opposite effect on $t_{Tf}$ and $t_{Zf}$, for example, it may reduce $t_{Tf}$ while increasing $t_{Zf}$, or it may increase $t_{Zf}$ while reducing $t_{Tf}$. When the solution represented by the optimized values $a_{Zacc}^*$ and $a_{Zdec}^*$ of $a_{Zacc}$ and $a_{Zdec}$ is found, the difference $\Delta t_f$ between the final times $t_{Tf}$ and $t_{Zf}$ may become substantially zero.

One or more embodiments of the method transporting a substrate with a substrate support, also known as robot trajectory generation, of the disclosed embodiment discussed above with reference to one or more of FIGS. 1-7, provide a solution to the problems associated with conventional trajectory generation algorithms. In general, the methods discussed above and herein may build on the well-known approach of s-curves and time-optimum trajectories, which may be the most common ways of determining motion profiles along a given path, where motion profiles typically refer to position, velocity, and acceleration data as a function of time. However, one or more of the methods discussed above, and herein may feature the one or more of the following: (1) The acceleration and deceleration phases of the motion profiles may not be symmetric, i.e., different constraints may be used in the two phases. (2) The motion profiles for moves that take place simultaneously, such as a rotational move and a vertical height adjustment, may not be calculated independently, but may result from calculations that take into account both moves. For example, the acceleration and deceleration levels of a rotational move may be adjusted to reflect the increase or reduction of substrate holding force due to simultaneous motion in the vertical direction and the acceleration and deceleration levels for the rotational and vertical moves may also be calculated so that the two moves finish at the same time, as opposed to one of them being completed earlier, thus optimizing the motion profiles for both moves. (3) The motion profile for the vertical height adjustment may be frequency-shaped so that the frequency content of the motion profile does not excite the structure of the arm and end-effector, i.e., does not include frequency components at or close to resonance conditions. A filter with notch, band-stop, low-pass characteristics, and the like, may be applied to the vertical trajectory for this purpose. (4) Motion profiles for moves in the plane of operation of the arm of the robotic manipulator may also be frequency shaped to remove high-frequency content that requires high bandwidth of the motion controller to achieve acceptable tracking errors. A low-pass filter may be utilized for this purpose.

For example, considering a rotation and a simultaneous vertical move in the upward direction, the acceleration level in the acceleration phase of the rotational move may be increased as the available substrate holding force is higher due to simultaneous acceleration in the upward direction. The deceleration phase of the rotational move, on the other hand, may be slower, utilizing a lower deceleration level, because the available substrate holding force is reduced due to simultaneous acceleration in the downward direction. In addition, the acceleration and deceleration levels for both moves may be calculated so that the duration of both moves is the same. This may be conveniently achieved in accordance with one or more of the methods discussed above by scaling a single motion profile to adapt it to both moves. The method of one or more embodiments of the disclosed embodiment applies to any shapes of motion profiles used for the simultaneous moves.

When rotational (T-axis) move of a robot with a single end-effector is used, the center point of the end-effector moves along a circular arc, i.e., the T-coordinate changes while the R-coordinate (the distance of the center of the end-effector from the center of the robot) remains constant. The trajectory according to the one or more embodiments of methods discussed above may typically be constrained by maximum velocity, available frictional force to prevent substrate slippage (substrate holding force) and tangential jerk imposed on the center point of the end-effector, all considered in the plane of the end-effector, where the available frictional force is a function of the Z-axis acceleration. Additional constraints, e.g., robot motor torque or more complex actuator dynamics, may also be included. Similarly, a trajectory for a Z-axis move, which may take place simultaneously with the T-axis move, may typically be constrained by maximum velocity, maximum allowable acceleration and deceleration, and maximum jerk. Additional constraints, e.g., Z-axis motor torque or more complex actuator dynamics, may also be included.

The optimal trajectories are preferably obtained when the end-effector moves along the desired path in such a manner that at least one of the constraints is active at any point of the trajectory.

Exemplary Z-axis and T-axis acceleration profiles are shown in FIG. 6. As shown, accelerations are shown in m/s² and time is in seconds. This example was generated using the following parameters: coefficient of friction between the substrate and the robot end-effector f=0.25, gravity acceleration g=10 m/s², allowable acceleration of the Z-axis $a_{zacc}$=10 m/s² and allowable deceleration of the Z-axis $a_{zdec}$=−5 m/s².

As can be seen, the trajectory for the Z-axis may be constrained by maximum allowable jerk in time interval $t_0$ to $t_1$, maximum allowable acceleration in time interval $t_1$ to $t_5$, allowable jerk in time interval $t_5$ to $t_6$, maximum allowable velocity in time interval $t_6$ to $t_8$, allowable jerk in time interval $t_8$ to $t_9$, allowable deceleration in time interval $t_9$ to $t_{12}$, and allowable jerk in time interval $t_{12}$ to $t_{13}$.

Similarly, the T-axis trajectory as shown may be constrained by the maximum tangential jerk in time interval $t_0$ to $t_2$. In time interval $t_2$ to $t_5$, the trajectory may be constrained by the maximum available frictional force to prevent substrate slippage, which may be translated to maximum allowable total acceleration in the plane of the end-effector. The maximum allowable total acceleration in the plane of the end-effector depends on the coefficient of friction f, gravity acceleration g and Z-axis acceleration $a_{zacc}$, and can be expressed in terms of the tangential and centrifugal components by the equation:

$$a_{total} = \sqrt{a_t^2 + a_c^2} = \sqrt{\dot{v}^2 + v^4/r^2} \quad (12)$$

where r denotes radius of rotation. In time interval $t_2$ to $t_3$, the tangential acceleration may decrease as increasing velocity may lead to higher centrifugal component of the total acceleration in the plane of the end-effector. In time interval $t_3$ to $t_4$, the tangential acceleration may be substantially zero, the velocity may remain substantially constant, and the centrifugal component may be substantially equal to the acceleration constraint.

In time interval $t_4$ to $t_5$, the tangential acceleration may decrease and the centrifugal acceleration may be reduced, while satisfying equation (12) above, in order to achieve the tangential acceleration level needed at the beginning of time interval $t_5$ to $t_6$. In time interval $t_5$ to $t_6$, the available frictional force is gradually being reduced as the acceleration of the Z-axis decreases. Consequently, the T-axis may continue to decelerate while keeping the total acceleration in the plane of the end-effector at the acceleration constraint associated with the available frictional force. In time interval $t_6$ to $t_7$, the tangential acceleration may become substantially zero as the centrifugal component may become substantially equal to the acceleration constraint and the velocity may be substantially constant.

In time interval $t_7$ to $t_8$, the tangential acceleration may decrease and the centrifugal acceleration may be reduced, still satisfying equation (12), in order to achieve the tangential acceleration level needed at the beginning of time interval $t_8$ to $t_9$. In time interval $t_8$ to $t_9$, the available frictional force may be reduced gradually as the Z-axis starts to decelerate. Consequently, the T-axis may continue to decelerate while keeping the total acceleration in the plane of the end-effector at the acceleration constraint associated with the available frictional force. In time interval $t_9$ to $t_{10}$, the tangential acceleration may become substantially zero as the centrifugal component may become substantially equal to the acceleration constraint and the velocity may be substantially constant.

In time interval $t_{10}$ to $t_{11}$, the tangential acceleration may again decrease and the centrifugal acceleration may be reduced, still satisfying equation (12), in order to initiate the final deceleration phase of the T-axis move. Finally, in time interval $t_{11}$ to $t_{13}$, the T-axis trajectory is constrained by allowable tangential jerk. The end-effector is brought to substantially complete stop at time $t_{13}$.

In summary, the method transporting a substrate with a substrate support of the disclosed embodiment discussed above with reference to one or more of FIGS. 1-5 may provide improvements over the conventional methods discussed above which may translate to better substrate placement repeatability and throughout performance. These improvements may include, inter alia: (1) Trajectories for T-axis and Z-axis moves may be fully synchronized, i.e., they may start and end at the same time, This may be achieved by scaling the same normalized profile or by reducing the maximum jerk of the shorter-duration move (smoother motion, less excitation and end-effector vibration). (2) Higher acceleration or deceleration levels may be used for the Z-axis in the phases when they increase the available force to hold the substrate on the robot end-effector. This may be in the acceleration phase of an upward move and deceleration phase of a downward move. (3) Lower acceleration or deceleration levels may be used for the Z-axis in the phases when they reduce the available force to hold the substrate on the robot end-effector. This typically occurs in the deceleration phase of an upward move and acceleration phase of a downward move. (4) The trajectories for T-axis moves and Z-axis moves (or any other moves that take place simultaneously) may be optimized together to provide the shortest substrate transfer time with as uniform slippage margin as possible or practical. (5) Frequency shaping may be applied to Z-axis trajectories in order to remove frequency contents that may excite the robot end-effector and cause vibration. A filter with notch, band-stop, low-pass characteristics, and the like, may be applied to the vertical trajectory for this purpose. (6) Frequency shaping may also be applied to T-axis. R-axis and other moves in the plane of operation of the arm of the robotic manipulator to remove high-frequency content that requires high bandwidth of the motion controller to achieve acceptable tracking errors. A low-pass filter may be utilized for this purpose. Frequency shaping for T-axis, R-axis and other moves in the plane of the end-effector is important to achieve the desired level of performance of direct-drive robotic manipulators where the bandwidth of the motion controller is often limited by closed-loop stability issues.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A method of transporting a substrate with a substrate support, the method comprising:
    defining a frictional breakaway force between the substrate and the substrate support in a horizontal plane;
    moving the substrate in the horizontal plane along a horizontal trajectory;
    moving the substrate in a vertical direction along a vertical trajectory simultaneously while moving the substrate in the horizontal plane; and
    wherein the horizontal trajectory is determined based on the acceleration profile of the vertical trajectory and wherein the horizontal trajectory prevents the moving of the substrate from overcoming the coefficient of friction in the horizontal plane.

2. The method of claim 1 wherein the horizontal plane substantially coincides with an interface between the substrate and the substrate support.

3. The method of claim 1 wherein an acceleration phase and a deceleration phase of the horizontal trajectory are asymmetric.

4. The method of claim 1 wherein at least one of the horizontal trajectory and the vertical trajectory are frequency shaped and configured to not excite a natural frequency of the substrate support and/or limit a control bandwidth.

5. The method of claim 1 wherein the horizontal trajectory includes one or more components in more than one direction.

6. The method of claim 1 wherein the frictional breakaway force is a variable function of an acceleration component perpendicular to the plane and a coefficient of friction.

7. The method of claim 1 wherein the horizontal trajectory is configured as a function of the vertical trajectory.

8. A method of transporting a substrate with a substrate support, the method comprising:
    defining a maximum holding force between the substrate and the substrate support in a plane;
    moving the substrate in the plane along a first trajectory;
    moving the substrate in a vertical direction along a second trajectory simultaneously while moving the substrate in the plane; and
    wherein a maximum holding force is a function of the second trajectory and a coefficient of friction between the substrate and the substrate support and wherein the first trajectory has an acceleration change based on the acceleration of the second trajectory and wherein the acceleration change prevents the substrate from overcoming the maximum holding force in the plane and/or exceeding a control bandwidth.

9. The method of claim 8 wherein the plane substantially coincides with an interface between the substrate and the substrate support.

10. The method of claim 8 wherein an acceleration phase and a deceleration phase of the first trajectory are asymmetric.

11. The method of claim 8 wherein at least one of the first trajectory and the second trajectory are frequency shaped and configured to not excite a natural frequency of the substrate support.

12. The method of claim 8 wherein the first trajectory includes one or more components in more than one direction.

13. The method of claim 8 wherein the first trajectory includes one or more linear components and one or more rotational components.

14. The method of claim 1 wherein the first trajectory is configured as a function of the second trajectory.

15. A method of transporting a substrate with a substrate transport, the method comprising:
    defining a bandwidth of the substrate transport;
    moving a substrate along a motion profile; and
    wherein the motion profile has selectable frequency components removed with respect to the bandwidth of the substrate transport.

16. The method of claim 15 wherein the motion profile is frequency shaped with at least one of a notch filter, a band stop filter or a low pass filter.

17. The method of claim 15 wherein the bandwidth comprises defining a natural frequency of the substrate transport and wherein the motion profile is frequency shaped to substantially not excite the natural frequency of the substrate transport.

18. The method of claim 15 wherein a vertical component of the motion profile is frequency shaped such that the vertical component of the motion profile substantially does not excite a natural frequency of the substrate transport in a vertical direction.

19. The method of claim 15 wherein a planar component of the motion profile is frequency shaped such that the planar component of the motion profile substantially does not excite a natural frequency of the substrate transport in a planar direction.

20. The method of claim 15 wherein a rotational component of the motion profile is frequency shaped such that the rotational component of the motion profile substantially does not excite a natural frequency of the substrate transport in a rotational direction.

* * * * *